United States Patent
Ko

(10) Patent No.: US 7,301,167 B2
(45) Date of Patent: Nov. 27, 2007

(54) ORGANIC LIGHT EMITTING DEVICES AND ELECTROLUMINESCENT DISPLAY PANEL APPLYING THE SAME

(75) Inventor: Chung-Wen Ko, Sijhih (TW)

(73) Assignee: AU Optronics Corp., Hsinchu (TW)

( * ) Notice: Subject to any disclaimer, the term of this patent is extended or adjusted under 35 U.S.C. 154(b) by 337 days.

(21) Appl. No.: 11/091,044

(22) Filed: Mar. 28, 2005

(65) Prior Publication Data

US 2006/0011927 A1    Jan. 19, 2006

Related U.S. Application Data

(63) Continuation-in-part of application No. 10/892,017, filed on Jul. 14, 2004, now abandoned.

(51) Int. Cl.
*H01L 29/08* (2006.01)
*H01L 35/24* (2006.01)

(52) U.S. Cl. ............................. 257/40; 257/130

(58) Field of Classification Search ............ 257/40, 257/130
See application file for complete search history.

(56) References Cited

U.S. PATENT DOCUMENTS

| 6,013,384 | A | 1/2000 | Kido et al. ............... 428/690 |
| 6,137,223 | A | 10/2000 | Hung et al. ............... 313/506 |
| 6,579,629 | B1 | 6/2003 | Raychaudhuri et al. ..... 428/690 |
| 6,833,201 | B2* | 12/2004 | Czerw et al. ............... 428/690 |
| 7,147,936 | B2* | 12/2006 | Louwet et al. ............. 428/690 |
| 2004/0214041 | A1* | 10/2004 | Lu et al. ..................... 428/690 |
| 2005/0003574 | A1* | 1/2005 | Yang et al. .................... 438/99 |
| 2005/0227406 | A1* | 10/2005 | Shtein et al. ................ 438/99 |
| 2006/0014044 | A1* | 1/2006 | Ko ............................. 428/690 |
| 2006/0238112 | A1* | 10/2006 | Kasama et al. ............ 313/504 |

FOREIGN PATENT DOCUMENTS

| JP | 04-137666 | 5/1992 |
| JP | 09-152726 | 6/1997 |
| JP | 11-087064 | 3/1999 |

OTHER PUBLICATIONS

Taiwan Office Action.

* cited by examiner

*Primary Examiner*—Fernando L. Toledo
(74) *Attorney, Agent, or Firm*—Thomas, Kayden, Horstemeyer & Risley

(57) ABSTRACT

Organic light emitting devices include an anode, a cathode and a plurality of organic light emitting units. The adjacent organic light emitting units are separated by a charge transfer layer formed of various fullerenes in combination. The charge transfer layer may be a relatively homogenous layer that is a mixture comprising fullerene.

33 Claims, 5 Drawing Sheets

ORGANIC LIGHT EMITTING DEVICES AND ELECTROLUMINESCENT DISPLAY PANEL APPLYING THE SAME

This is a CIP of application Ser. No. 10/892,017, filing date Jul. 14, 2004 now abandoned.

The invention relates to electroluminescent display devices, and more particularly, to organic light emitting devices and electroluminescent display panel applying the same.

Organic light emitting devices (OLEDs), for example organic light emitting diodes, are broadly researched and utilized for their application in flat-panel display devices. Flat-panel display devices employing OLEDs are brighter than liquid crystal display (LCD) devices because OLEDs can emit light and do not require backlight systems. Additionally, with different organic materials, OLEDs can emit light in red, green and blue colors with high luminance efficiency. Moreover, OLEDs can operate with low driving voltages and are viewable from oblique angles.

OLEDs typically have a plurality of layers, including an organic light emitting unit sandwiched between an anode and a cathode. Buffer layers are often included between the organic light emitting unit and the anode and/or between the organic light emitting unit and the cathode. The organic light emitting unit may consist of multiple layers which typically comprise an electron transport layer (ETL), an emissive layer (EML), a hole transport layer (HTL) and a hole injection layer (HIL). The basic principle of operation for OLEDs is that, when current is applied across the anode and cathode, electrons and holes are driven to move to the organic light emitting unit. The electrons and holes meet and emit light. More particularly, when a migrating electron drops from its conduction band potential to a valance band potential in filling a hole, energy is released in the emissive layer as light, which is observable through the light-transmissive substrate upon which the OLEDs are formed. U.S. Pat. Nos. 6,137,223, 6,579,629 and 6,013,384 are expressly incorporated by reference herein in their entireties, for their teachings on OLEDs.

Limitations of the conventional OLEDs are due to the single organic light emitting unit conventionally used. For example, the characteristics of the single organic light emitting unit determine the efficiency of the optical light emitting device and the maximum achievable luminescence and brightness. The disclosure addresses this limitation.

SUMMARY

Organic light emitting devices are provided. An exemplary embodiment of an organic light emitting device comprises an anode and a cathode. A plurality of organic light emitting units is disposed between the anode and the cathode. At least one charge transfer layer is disposed between adjacent organic light emitting units, wherein the charge transfer layer comprises fullerene, $FeCl_3$, $SbCl_5$, 7,7,8,8-tetracyanoquinodimethane (TCNQ), 2,3,5,6-tetrafluoro-7,7,8,8-tetracyanoquinodimethane (F4-TCNQ), lithium (Li), sodium (Na), potassium (K), cesium (Cs), magnesium (Mg), calcium (Ca), silver (Ag), aluminum (Al), nickel (Ni), tetrathiafulvalenes (TTF), bis(ethylenedithio)tetrathiafulvalenes (BEDT-TTF) or combinations thereof.

Methods of forming organic light emitting devices are provided. In an exemplary embodiment of a method of forming an organic light emitting device, an anode is formed on a transparent substrate. A cathode is formed above the anode. A plurality of organic light emitting units is formed between the anode and the cathode. A charge transfer layer comprising fullerene is formed on adjacent organic light emitting units.

Electroluminescent display panels are also provided. An exemplary embodiment of an electroluminescent display panel comprises a transparent anode disposed on a transparent substrate. A first organic light emitting unit is disposed on the transparent anode. A charge transfer layer comprising fullerene is disposed on the first organic light emitting unit. A second organic light emitting unit is disposed on the charge transfer layer. A cathode is disposed on the second organic light emitting unit.

The organic light emitting device comprises a plurality of organic light emitting units. A charge transfer layer is disposed between adjacent organic light emitting units. An organic light emitting device with multiple light emitting modules can thus be formed, improving emission efficiency and the maximum achievable luminescence.

DESCRIPTION OF THE DRAWINGS

The invention will become more fully understood from the detailed description given in the following and the accompanying drawings, given by way of illustration only and thus not intended to be limitative, and wherein.

DETAILED DESCRIPTION

Figure 1:
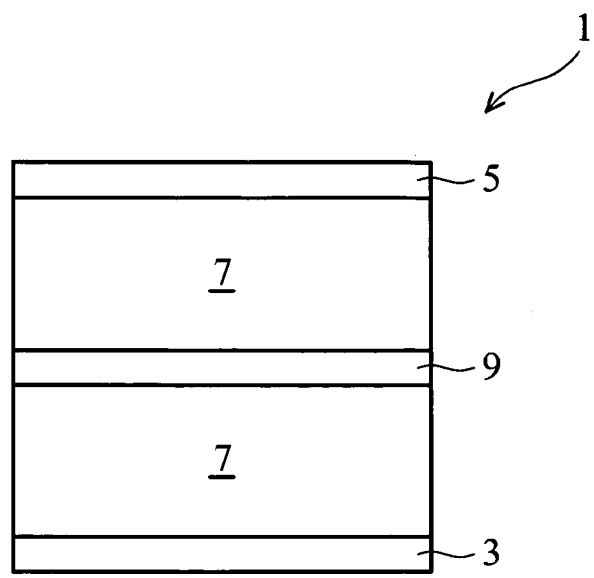
FIG. 1 is a schematic view of an embodiment of an OLED.
Figure 2:
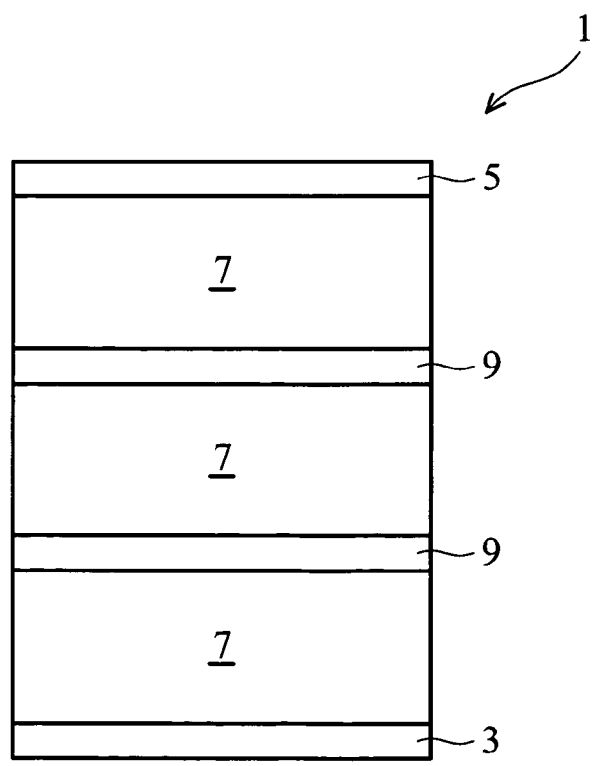
FIG. 2 is a schematic view of another embodiment of an OLED.
Figure 3:
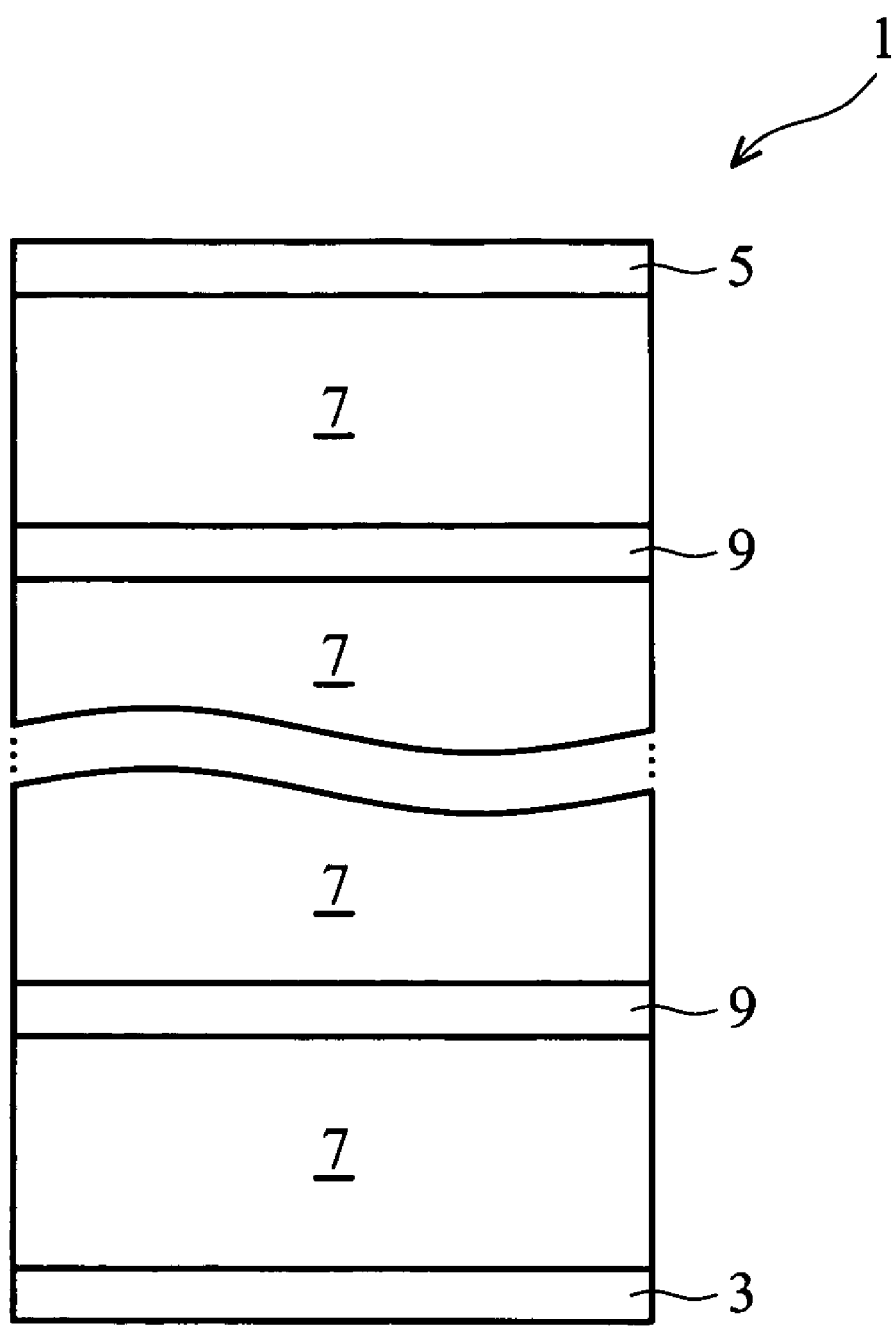
FIG. 3 is a sectional view representing a general structure of some embodiments of an OLED.

Organic light emitting devices (OLEDs) are provided. Light is produced when holes and electrons combine to emit energy in an organic light emitting unit that emits light as electromagnetic radiation in response to the energy released by the combination of the electron-hole pair. Stated alternatively, the organic light emitting structure emits light in response to the application of an electric potential difference across the anode and cathode, such potential difference causes electrons from the cathode to travel toward the anode and holes from the anode to travel toward the cathode, and the electrons and holes meet and recombine in an organic light emitting layer. FIG. 1 shows an exemplary OLED 1 that comprises two organic light emitting units 7 separated by a charge transfer layer 9. FIG. 2 shows another exemplary OLED 1 that comprises three organic light emitting units 7, wherein adjacent organic light emitting Units 7 are separated by a charge transfer layer 9. FIG. 3 is a sectional view generally depicting a concept of the invention and represents that an embodiment of an OLED 1 comprises a plurality of organic light emitting units 7, wherein adjacent organic light emitting units 7 are separated by a charge transfer layer 9. Each of the embodiments shown in FIGS. 1-3 illustrates some embodiments of OLED 1 comprising an anode 3 and a cathode 5. In an exemplary embodiment, the anode 3 may be formed over a light-transmissive substrate (not shown) which may be made of glass, quartz, plastics or other suitable materials. The anode 3 may be formed of conductive and light-transmissive material such as indium-tin-oxide (ITO), indium-zinc-oxide (IZO) or other suitable materials. The cathode 5 may be made of various suitable metals. The anode 3 may alternatively be formed of a thin opaque or transparent conductive material. In each exemplary embodiment, OLED 1 may additionally comprise an optional buffer layer or layers disposed between the cathode 5 and the nearest organic light emitting unit 7 and/or between anode 3 and the adjacent organic light emitting unit 7.

Figure 4A:
FIG. 4A is a schematic view of an embodiment of an organic light emitting unit of an OLED.
Figure 4B:
FIG. 4B is a schematic view of another embodiment of an organic light emitting unit of an OLED.

Referring to FIGS. 1-3, at least one charge transfer layer 9 is disposed between adjacent organic light emitting units 7. Some embodiments of the organic light emitting unit 7 used in the structures of FIGS. 1-3 are shown in more detail in FIGS. 4A and 4B. Some embodiments of the charge transfer layer 9 are shown in more detail in FIGS. 5A and 5B. The organic light emitting unit 7 may consist of three, four or other numbers of layers in various exemplary embodiments. FIG. 4 shows organic light emitting unit 7 comprising four layers: hole injection layer (HIL) 13, hole transport layer (HTL) 15, emissive layer (EML) 17 and electron transport layer (ETL) 19. In another exemplary embodiment, the HIL 13 may not be employed and the organic light emitting unit 7 may therefore consist of three layers 15, 17 and 19, as shown in FIG. 4B. Various thicknesses and various materials may be used to form these layers, and representative materials are described in previously incorporated U.S. Pat. No. 6,579,629. The HIL 13 and HTL 15 can be formed of hole-conducting materials or p-type (i.e. p-doping) materials, and the HIL 13 is preferably a material with high hole conductibility. The ETL 19 and EML 17 can be formed of electron-conducting materials or n-type (i.e. n-doping) materials, and the ETL 19 is preferably a material with high electron conductibility. Various suitable dopants are available to suitably dope to the HIL 13, the HTL 15, the EML 17 and the ETL 19. The emissive layer 17 comprises an electroluminescent material that emits light when an electron-hole pair recombines in this layer.

Figure 5A:
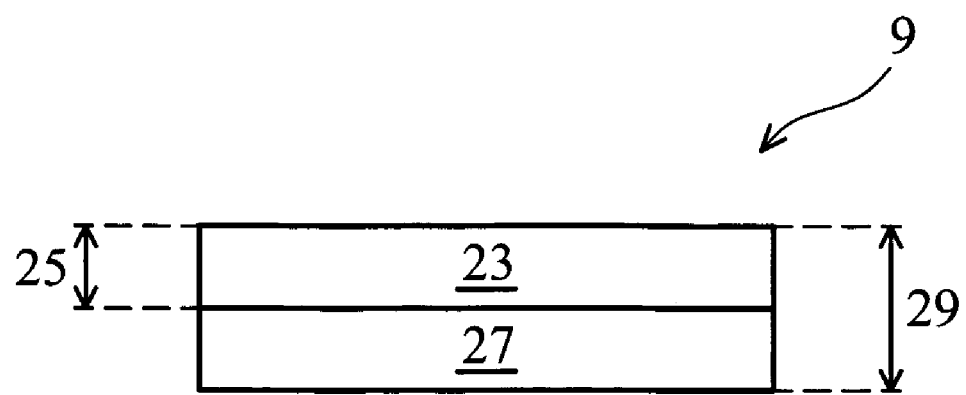
FIG. 5A is a schematic view of an embodiment of a charge transfer layer of an OLED.
Figure 5B:
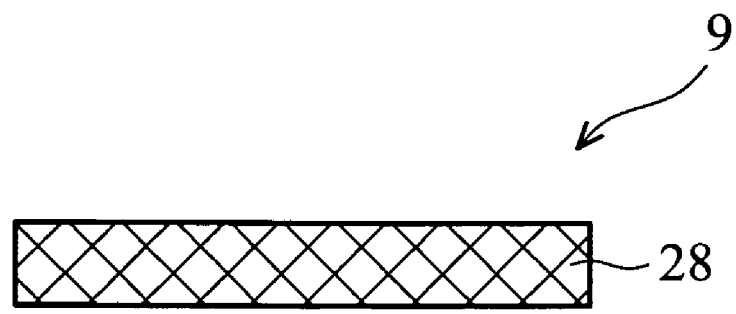
FIG. 5B is a schematic view of another embodiment of a charge transfer layer of an OLED.

FIGS. 5A and 5B shows some embodiments of the charge transfer layer 9. In one exemplary embodiment, the charge transfer layer 9 comprises fullerene, $FeCl_3$, $SbCl_5$, 7,7,8,8-tetracyanoquinodimethane (TCNQ), 2,3,5,6-tetrafluoro-7,7,8,8-tetracyanoquinodimethane (F4-TCNQ), lithium (Li), sodium (Na), potassium (K), cesium (Cs), magnesium (Mg), calcium (Ca), silver (Ag), aluminum (Al), nickel (Ni), tetrathiafulvalenes (TTF), bis(ethylenedithio)tetrathiafulvalenes (BEDT-TTF) or combinations thereof. The above materials of the charge transfer layer 9 are divided into a first material and a second material. The first material may be fullerene, $FeCl_3$, $SbCl_5$, TCNQ, F4-TCNQ or other materials with excellent electron-accepting ability, and the second material may be Li, Na, K, Cs, Mg, Ca, Ag, Al, Ni, TTF, BEDT-TTF or other materials with strong electron-donating ability. The fullerene may be buckminsterfullerene comprising 60 carbons and is thus designated C60. In other exemplary embodiments, the fullerene may comprise different numbers of carbons such as C70, C76, C78, C82, C84, C90, C96 or combinations thereof. In one embodiment, the charge transfer layer 9 comprises an electron-accepting first material and an electron-donating second material. For example, the charge transfer layer 9 is formed of a first material of at least one of fullerene, $FeCl_3$, $SbCl_5$, TCNQ, F4-TCNQ or other materials with excellent electron-accepting ability, and a second material of at least one of Li, Na, K, Cs, Mg, Ca, Ag, Al, Ni, TTF, BEDT-TTF or other materials with strong electron-donating ability.

In one exemplary embodiment such as shown in FIG. 5A, the charge transfer layer 9 may be a multilayer structure comprising at least two distinct layers such as a first layer 23 and a second layer 27. The first layer 23 is formed of the first material. The second layer 27 is formed of the second material other than the first material. The first layer 23 is adjacent to the HIL 13 or HTL 15. The second layer 27 is adjacent to the ETL 19. In this exemplary embodiment, the first layer 23 may have a thickness 25 within the range of 1-200 nanometer and the charge transfer layer 9 may have an overall thickness 29 within the range of 1-500 nanometer, but other thicknesses may be used in other exemplary embodiments.

In another exemplary embodiment such as shown in FIG. 5B, the charge transfer layer 9 may be formed of a generally homogenous single layer 28 formed of a mixture of the first and second materials, with the first material (e.g. fullerene) included at a weight percentage ranging from 0.5-99.5% by weight. In one exemplary embodiment, the charge transfer layer 9 can be formed solely of the first material, for example, fullerene. In another exemplary embodiment, the first material may be a p-type material or a triarylamine. The first material also is employed to form HTL 15 or HIL 13 in one or more of the organic light emitting units 7. That is, the charge transfer layer 9 can comprise a fullerene layer and a second hole transport or injection layer, wherein the thickness of the fullerene layer is about 1-200 nanometer. The second hole transport or injection layer comprise p-type material comprising TCNQ, F4-TCNQ, $FeCl_3$ or $SbCl_5$.

In one exemplary embodiment, at least one of the organic light emitting units 7 may comprise the HIL 13 and/or HTL 15 formed of CuPc, copper phthalocyanine or NPB (4,4-bis-[N-(1-Naphthyl)-N-Phenylamino]-biphenyl), but other suitable materials may be used.

Figure 6:
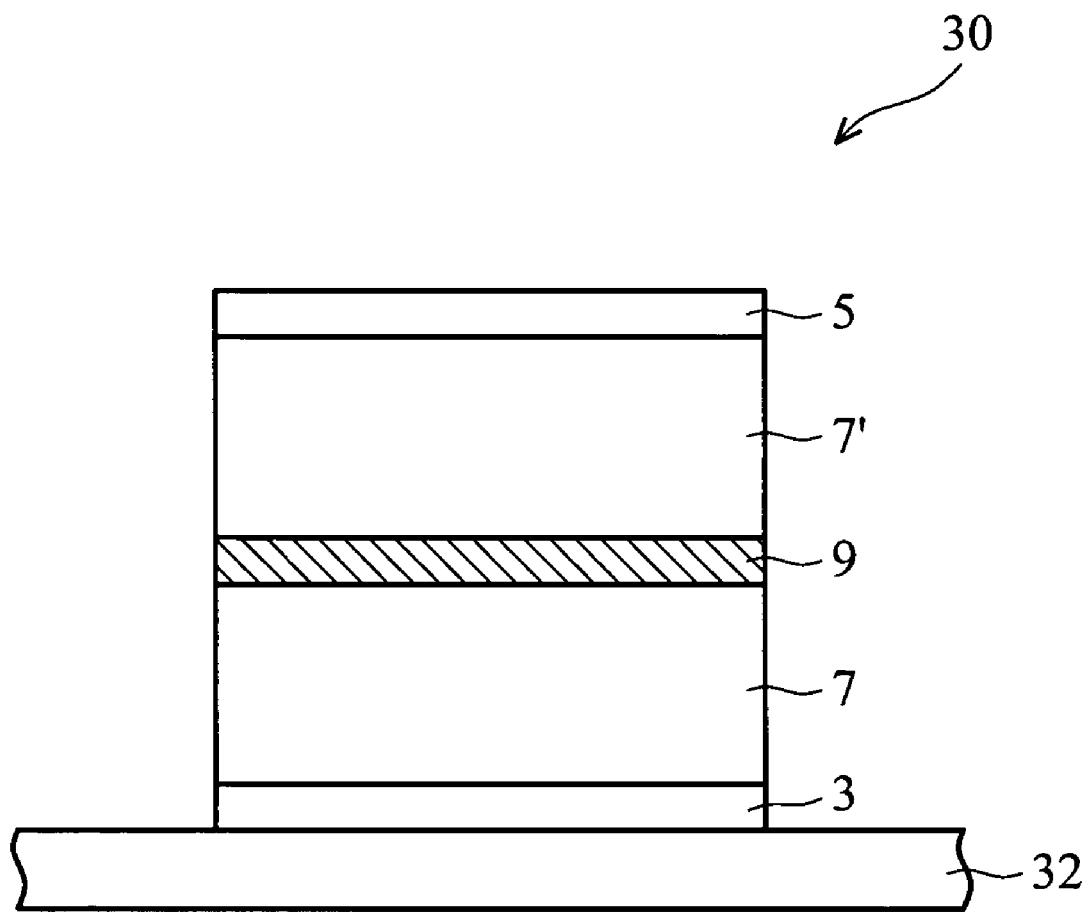
FIG. 6 is a sectional view of an embodiment of an electroluminescent display panel incorporating an embodiment of an OLED.

FIG. 6 is a sectional view of an embodiment of an electroluminescent display panel 30 incorporating the OLED 1. The panel 30 comprises a transparent anode 3 located on a substrate 32. A first organic light emitting unit 7 is located on the anode 3. A charge transfer layer 9 comprising fullerene is located on the first organic light emitting unit 7. A second organic light emitting unit 7' is located on the charge transfer layer 9. A cathode 5 is located on the second organic light emitting unit 7'.

The disclosure also provides a method for forming the various described OLED structures using deposition processes to sequentially form each of the aforementioned films. The method generally comprises forming an anode over a light transmissive substrate, forming a cathode over the anode, forming a plurality of organic light emitting units between the anode and the cathode, and forming a charge transfer layer between each adjacent set of the organic light emitting units, which themselves may be formed using a sequence of operations. Chemical vapor deposition (CVD), physical vapor deposition (PVD), sputtering, thermal evaporation, e-beam deposition, or other conventional methods may be used to form the sequence of films over a transparent substrate.

While the invention has been described by way of example and in terms of preferred embodiment, it is to be understood that the invention is not limited thereto. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. An organic light emitting device, comprising:
   an anode and a cathode;
   a plurality of organic light emitting units disposed between the anode and the cathode; and
   at least one charge transfer layer disposed between adjacent organic light emitting units, wherein the charge transfer layer comprises fullerene, $FeCl_3$, $SbCl_5$, 7,7,8,8-tetracyanoquinodimethane (TCNQ), 2,3,5,6-tetrafluoro-7,7,8,8-tetracyanoquinodimethane (F4-TCNQ), lithium (Li), sodium (Na), potassium (K), cesium (Cs), magnesium (Mg), calcium (Ca), silver (Ag), aluminum (Al), nickel (Ni), tetrathiafulvalenes (TTF), bis(ethylenedithio)tetrathiafulvalenes (BEDT-TTF) or combinations thereof.

2. The device according to claim 1, wherein the charge transfer layer is a single layer formed of a mixture comprising fullerene and the concentration of fullerene of the mixture is about at 0.5 to 99.5 wt %.

3. The device according to claim 1, wherein the organic light emitting unit comprises an electron transport layer, an emissive layer, a hole transport layer and a hole injection layer, in which at least one of the hole transport layer and the hole injection layer comprises, copper phthalocyanine (CuPc) or (4, 4-bis-[N-(1-naphthyl)-N-phenylamino]-biphenyl) (NPB).

4. The device according to claim 1, wherein the fullerene comprises C70, C76, C78, C82, C84, C90, C96 or combinations thereof.

5. The device according to claim 1, wherein the charge transfer layer comprises a fullerene layer and a hole transport layer.

6. The device according to claim 5, wherein the thickness of the fullerene layer is about between 1 nanometer and 200 nanometer.

7. The device according to claim 5, wherein the hole transport layer comprises p-type dopant.

8. The device according to claim 7, wherein the p-type dopant is TCNQ, F4-TCNQ, $FeCl_3$ or $SbCl_5$.

9. The device according to claim 1, wherein the thickness of the charge transfer layer is about between 1 nanometer and 500 nanometer.

10. The device according to claim 1, wherein the charge transfer layer is a multilayer structure.

11. The device according to claim 1, wherein the material of the charge transfer layer comprises electron donating material or electron accepting material.

12. The device according to claim 1, wherein the organic light emitting unit comprises an electron transport layer, an emissive layer and a hole transport layer.

13. The device according to claim 12, wherein the organic light emitting unit further comprises a hole injection layer.

14. The device according to claim 1, further comprising at least one buffer layer located between the cathode and the adjacent organic light emitting unit and/or between the anode and the adjacent organic light emitting unit.

15. The device according to claim 1, wherein the anode comprises indium-tin-oxide (ITO) or indium-zinc-oxide (IZO) and the cathode comprises opaque or transparent conductor.

16. An organic light emitting device, comprising:
    an anode;
    a first organic light emitting units disposed on the anode;
    a charge transfer layer disposed on the first organic light emitting unit, wherein the charge transfer layer comprises fullerene, $FeCl_3$, $SbCl_5$, 7,7,8,8-tetracyanoquinodimethane (TCNQ), 2,3,5,6-tetrafluoro-7,7,8,8-tetracyanoquinodimethane (F4-TCNQ), lithium (Li), sodium (Na), potassium (K), cesium (Cs), magnesium (Mg), calcium (Ca), silver (Ag), aluminum (Al), nickel (Ni), tetrathiafulvalenes (TTF), bis(ethylenedithio)tetrathiafulvalenes (BEDT-TTF) or combinations thereof;
    a second organic light emitting unit disposed on the charge transfer layer; and
    a cathode disposed on the second organic light emitting unit.

17. An electroluminescent display panel, comprising:
    a transparent substrate;
    a transparent anode disposed on the transparent substrate;
    a first organic light emitting unit disposed on the transparent anode;
    a charge transfer layer comprising fullerene disposed on the first organic light emitting unit;
    a second organic light emitting unit disposed on the charge transfer layer; and
    a cathode disposed on the second organic light emitting unit.

18. An organic light-emitting device comprising a light transmissive substrate, an anode, a cathode and a plurality of organic light-emitting units disposed between the anode and the cathode, adjacent organic light-emitting units separated by a charge transfer layer, wherein the charge transfer layer comprises a first layer of a first material being one of fullerene and $SbCl_5$, and a second layer of a second material.

19. The organic light-emitting device as in claim 18, wherein the second material comprises at least one of TTF, BEDT-TTF, lithium, sodium, potassium, cesium, magnesium, calcium, silver, aluminum, and nickel.

20. The organic light-emitting device as in claim 18, wherein each organic light-emitting unit comprises an electron transport layer, an emissive layer, a hole transport layer, and a hole injection layer, and at least one of a hole transport layer and hole injection layer is formed of CuPc or NPB.

21. The organic light-emitting device as in claim 18, wherein the first material comprises an electron accepting material and the second material comprises an electron donating material.

22. The organic light-emitting device as in claim 18, wherein each organic light-emitting unit comprises an electron transport layer, an emissive layer formed of electroluminescent material, and a hole transport layer, and the emissive layer is disposed between the electron transport layer and the hole transport layer.

23. The organic light-emitting device as in claim 21, wherein each organic light-emitting unit further comprises at least one hole injection layer, and the hole transport layer is disposed between the hole injection layer and the emissive layer.

24. The organic light-emitting device as in claim 18, further comprising at least one buffer layer disposed adjacent the cathode.

25. The organic light-emitting device as in claim 18, wherein a first organic light emitting unit is formed on the anode, the charge transfer layer is formed on the first organic light emitting unit, a second organic light emitting unit is formed on the charge transfer layer and the cathode is formed on the second organic light emitting unit, the anode, first organic light emitting unit, charge transfer layer, second organic light emitting unit and cathode arranged in parallel.

26. The organic light-emitting device as in claim 18, wherein the anode is formed of one of indium tin oxide, a further light transmissive material and an opaque material.

27. An organic light-emitting device comprising a light transmissive substrate, an anode, a cathode and a plurality of organic light-emitting units disposed between the anode and the cathode, adjacent organic light-emitting units separated by a charge transfer layer, wherein the charge transfer layer comprises a fullerene layer.

28. The organic light-emitting device as in claim 27, wherein the fullerene layer includes a structure comprising one of C60, C70, C76, C78, C82, C84, C90, and C96.

29. The organic light-emitting device as in claim 27, further comprising a hole transport layer contacting the fullerene layer.

30. The organic light-emitting device as in claim 29, wherein the hole transport layer comprises a p-type dopant material.

31. The organic light-emitting device as in claim 30, wherein the p-type dope material comprises TCNQ, F4-TCNQ, $FeCl_3$, or $SbCl_5$.

32. The organic light-emitting device as in claim 27, wherein the charge transfer layer has a thickness within a range of 1-500 nm and the fullerene layer has a thickness within a range of 1-200 nm.

33. An organic light-emitting device comprising a light transmissive substrate, an anode formed of a light-transmissive material disposed over the substrate, a first organic light-emitting unit disposed over the anode, a charge transfer layer including a first material layer containing fullerene and a second material layer disposed over the first organic light-emitting unit, a second organic light-emitting unit disposed over the charge transfer layer, and a cathode disposed over the second organic light-emitting unit.

* * * * *